United States Patent [19]

Deschler et al.

[11] Patent Number: 4,777,516
[45] Date of Patent: Oct. 11, 1988

[54] MONOLITHIC INTEGRATION OF LIGHT EMITTING ELEMENTS AND DRIVER ELECTRONICS

[75] Inventors: Marc M. Deschler, Hauset, Belgium; Meino Heyen, Aachen, Fed. Rep. of Germany

[73] Assignee: Agfa-Gevaert, N.V., Mortsel, Belgium

[21] Appl. No.: 850,053

[22] Filed: Apr. 10, 1986

[30] Foreign Application Priority Data

Apr. 23, 1985 [EP] European Pat. Off. ............ 85200627

[51] Int. Cl.[4] .................... H01L 33/00; H01L 29/161; H01L 29/48; H01L 29/06
[52] U.S. Cl. ........................................ 357/17; 357/15; 357/16; 357/22; 357/54; 357/55; 357/56; 357/71; 372/50
[58] Field of Search ................ 357/17, 22 A, 22 MD, 357/16, 15, 55, 56, 23.15, 54, 71; 372/50

[56] References Cited

U.S. PATENT DOCUMENTS 4,361,887 11/1982 Nakamura et al. .................... 357/17
4,608,696 8/1986 Law et al. ............................ 357/17
4,618,878 10/1986 Aoyama et al. ...................... 357/54
4,625,223 11/1986 Komatsubara et al. .............. 357/17

FOREIGN PATENT DOCUMENTS 57-79684 5/1982 Japan ........................................ 357/17
59-54271 3/1984 Japan ............................ 357/22 MD
59-100577 6/1984 Japan ............................ 357/22 MD

OTHER PUBLICATIONS

Gibbons et al., "Projected Range Statistics, Semiconductors and Related Materials", Dowdin, Hutchinson, and Ross, Inc., Standsbrug, U.S.A., (1985).
Lindhard et al., "Range Concepts and Heavy Ion Ranges", Selkab. Mat.-Fys. Medd., 33, No. 14, (1983).
Ury et al., "Monolithic Integration of an Injection Laser and a Metal Semiconductor for Field Effect Transistor", Appl. Phys. Lett., 34(7), Apr. 1, 1979.
Fukuzawa et al., "Monolithic Integration of a GaAlAs Injection Laser with a Schottky-Gate Field Effect Transistor", Appl. Phys. Lett., 36(3), Feb. 1, 1980.

Primary Examiner—James Carroll
Assistant Examiner—Ngân V. Ngô
Attorney, Agent, or Firm—A. W. Breiner

[57] ABSTRACT

The invention relates to the fabrication of modules consisting of a number of light-emitting elements (10) and the associated driver electronics (11) integrated on a common conductive p-type Gallium Arsenide substrate (12). The use of a number of such modules to form in a recording head an uninterrupted row of light-emitting elements is furthermore disclosed.

3 Claims, 11 Drawing Sheets

2nd METALLISATION

MONOLITHIC INTEGRATION OF LIGHT EMITTING ELEMENTS AND DRIVER ELECTRONICS

DESCRIPTION

The present invention relates to the monolithic integration of light-emitting devices and associated driver electronics on a single semiconductor substrate. A quasi-planar architecture for the opto-electrical integration is used.

The invention furthermore relates to a recording head for linewise recording information upon a photoreceptor that consists of aligned modules of light-emitting devices and driver electronics integrated on a common substrate.

Apparatus for recording information upon a movable photoreceptor are known comprising a plurality of stationary pointlike light-sources that are arranged in a row that extends transversely of the direction of displacement of the photoreceptor. Said pointlike light-sources are individually energizable thereby information-wise exposing the photoreceptor in response to information signals as the photoreceptor moves past the row of light-emitting sources.

The light-sources must be sufficienly small to achieve an acceptable image resolution and to obtain the visual impression of an uninterrupted transverse line.

To cover the width of a din A4 photoreceptor size, namely 216 mm, a number of at least 2200 discrete light-sources are required. This can be achieved by integrating a plurality of light-emittng diodes (LED) as an array of photo-emitters on a monolithic chip.

So far it is economically feasible to produce defect free LED arrays on mono-crystalline substrates with a length limitation ranging between 1 and 10 mm.

In order to form arrays of a length up to 216 mm a multiplicity of small modules must be assembled in alignment according to the method described in EU patent application No. 0.086.907.

However, each of these integrated optical light-emitting devices is to be driven by an electronic driver circuit. In the prior art such drivers are provided on an integrated circuit and are connected to the integrated LED array by classic wire bonding techniques.

Since optical devices and eectronic devices can be used to form a complex opto-electronic circuit, it is highly desirable to be able to integrate all devices on a single chip, yet provide the electrical insulation of the devices from one another for proper circuit operation.

Such integration is interesting from the viewpoint of reduced circuit size, reduced circuit cost in the long term, increased reliability. In addition, the functional capability of such devices is enhanced in terms of the speed and noise performances by the reduction of the parasitic reactances which results from the wire bonding device interconnection.

An extended review of the state of the art concerning integration of opto-electronic devices on GaAs substrates is given by Nadav Bar Chaim et Al. in IEEE Transactions on Electron Devices, Vol. ED-29, NO. 9, Sept. 82.

Opto-electronic integration on a GaAs substrate can be subdivided according to the electrical property of the substrate into devices integrated on a semi-insulating substrate and devices integrated on a conductive substrate.

Integration on a semi-insulating substrate in most cases results in a not planar integrated circuit because the optical components need a backside contact or backside driving by the electrical component. This non-planarity causes technological realisation problems, in particular for the photolithography.

Another integration method used when semi-insulating GaAs substrates are dealt with is described for the integration of a LED or LASER and photodetector together with electronic circuitry in Inside R and D, vol. 11, No. 13 of Mar. 31 1982.

Integration on a doped, conductive substrate provides an easier way to planarisation of the integrated device because in ths case the backside of the chip is used as backside contact for the optical devices. This type of architecture is, from the technological point of view, more adapted to the realisation of a complex opto-electronic integration. However an adequate insulation layer is needed to separate electrcally the devices from one another.

It is a primary object of the present invention to provide a complex electro-optical monolithic circuit.

It is another object of the present invention to provide a complex monolithic circuit in which light-emitting devices and associated driver electronics are fabricated on a single substrate yet are insulated from each other by an appropriate insulation layer for proper device operation.

Still another object of the invention is to realise the above-mentioned integration on a common conductive p-type GaAs substrate.

It is a further object of the present invention to provide said opto-electronic integration resulting in a planar integrated circuit.

Still a further object of the present invention is to provide a high-resolution recording-head for use in a recording apparatus, said recording-head consisting of a number of interconnected modules comprising light-emtting devices integrated together with the driver electronics on a common conductive p-type GaAs substrate.

Other objects of the present invention will become apparent from the description hereinafter.

These and other objects of the present invention are achieved by fabricating an integrated device, in the following called a module, comprising a GaAs p-type conductive layer representing a substrate, a number of double heterostructure light-emitting diodes each comprising a first layer of GaAs of p-type, a second layer of a ternary compound of $Al_xGa_{1-x}As$ of p-type, a third layer of a ternary compound of $Al_xGa_{1-x}As$ of n-type, a fourth layer of GaAs of n-type, said heterostructures being etched to form a number of mesas on top of said substrate.

a $SiO_2$-protecting layer grown on top of each mesa, a selectively grown GaAs undoped bufferlayer having a thickness equal to the height of said mesas and covering the surface of said substrate excluding each mesa.

a semi-insulating layer formed by the implantation of $O^+$-ions into said bufferlayer.

a number of field effect transistor mesas equal to said number of light-emitting diodes, being formed by Si-ion implantation and etching on top of said buffer layer, $SiO_2$-windows etched into said $SiO_2$-protecting layer, ohmic contacts on the backside of the substrate and on said $SiO_2$-protectlng layer close to the edges of said SiO$_2$-windows and on both sides of the field effect transistor mesas, forming source and drain electrodes, light-emitting diode windows etched in said fourth n-type GaAs layer of each of said light-emitting diodes, a first metallisation layer forming the bonding contacts and Schottky type contacts forming the gate electrodes of each of said field effect transistors, an insulating and planarising layer that covers said module, contact holes and light-emitting diode windows etched on said insulating and planarising layer, a second metallisation layer interconnecting said light-emitting diodes and said field effect transistors.

Another object of the present invention is realised by providing a recording head for linewise recording information upon a photoreceptor, said recording head being built up by a plurality of recording modules arranged so that an uninterrupted row of light-emitting elements is formed along the length of said recording head, characterised in that each of said modules comprises an integrated device as described hereinbefore.

DRAWINGS

The invention will be described hereinafter by way of example with reference to the accompanying drawings, wherein:

FIG. 1 shows a prior art opto-electronic device integrated on a semi-insulating GaAs substrate. (Cfr. Ury et Al. in Appl. Phys. Lett., 34, 430 (1979)), FIG. 2 shows a prior art opto-electronic device integrated on a conductive GaAs substrate. (Cfr. T. Fukuzawa et Al. in Apll. Phys. Lett., 36, 181 (1979)), FIG. 3 is a diagrammatic view of an embodiment of a recording apparatus wherein a recording head according to the present invention could be used, FIG. 4 is a diagrammatic view of the electronic configuration of one LED and one field effect transistor (FET), FIG. 5 is a view of the configuration of an integrated circuit comprising a LED and a FET, FIG. 6 a to p are diagrams of the subsequent integration steps.

FIG. 7 shows the I-V characteristic of the devices where a LED and a metal semiconductor field effect transistor (MESFET) are connected in series.

FIG. 8 shows the radiated light intensity of a LED as a function of the gate potential of a field effect transistor, FIG. 9 shows Si-ion and O$^+$-ion implantation profiles in the buffer layer, FIG. 10 shows the measured I-V characteristic of a recessed gate FET. The implantation energy of the channel is 50 and 110 KeV with implantation doses of $2.10^{13}$ cm$^{-2}$ and $5.10^{13}$ cm$^{-2}$ respectively.

FIG. 1 shows an example of one kind of an opto-electronic monolithic integration integrated on a semi-insulating substrate, while

Figure 1:
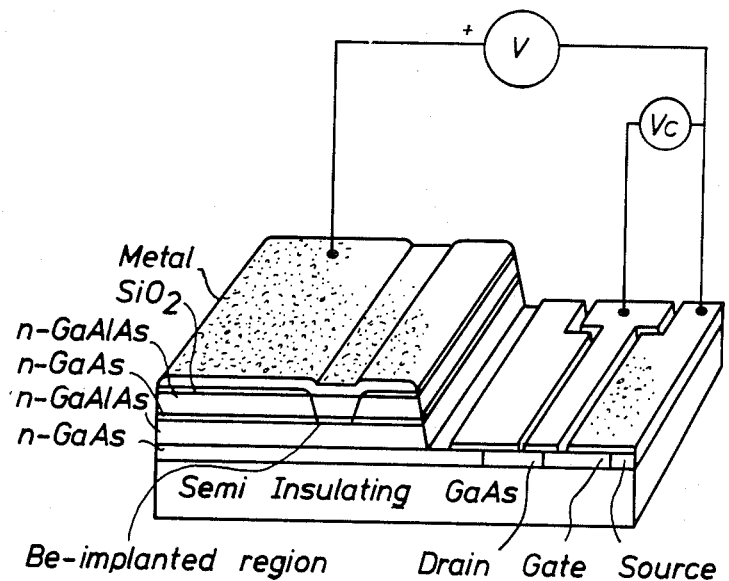

Referring to FIG. 1, an opto-electronic device comprising a beryllium implanted LASER and a MESFET integrated on a semi-insulating GaAs substrate is shown. The active layer of the transistor is also the interconnection layer between the transistor and the beryllium impanted laser. This kind of integration on a semi-insulating substrate implies the use of two levels on the surface of the wafer.

Figure 2:
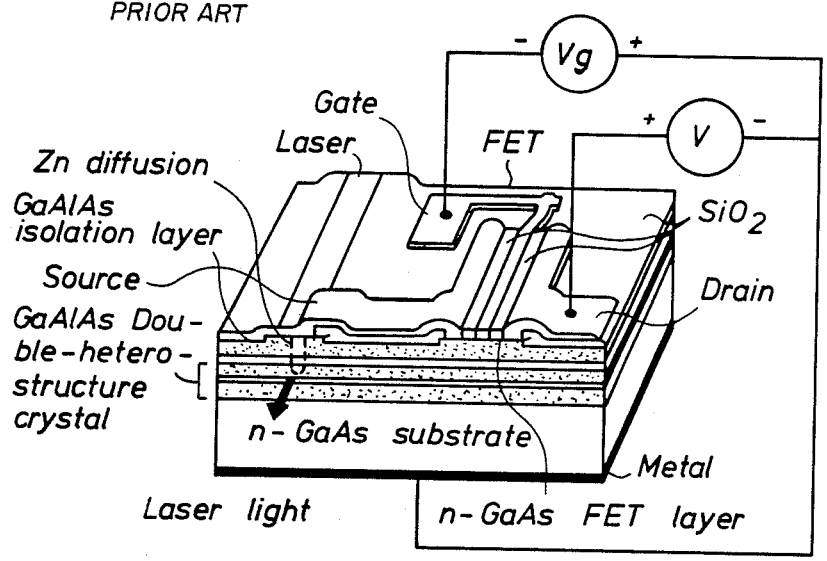
FIG. 2 shows another kind of opto-electronic monolithic integration integrated on a conductive substrate.

FIG. 2 shows a double heterostructure LASER (DH LASER) and a MESFET integrated on a n-type doped GaAs substrate. The electric insulation between the DH LASER and the MESFET is achieved by an AlGaAs insulation layer. Because one of the electric contacts of the optical devices can be provided on the backside of the device, optical and electronic components can be grown near to each other, allowing planarisation of the wafer. This type of architecture on a conductive substrate avoids technological problems (photolithography) and is more adaptable to complex integration than does the integration architecture on semi-insulating substrates.

Figure 3:
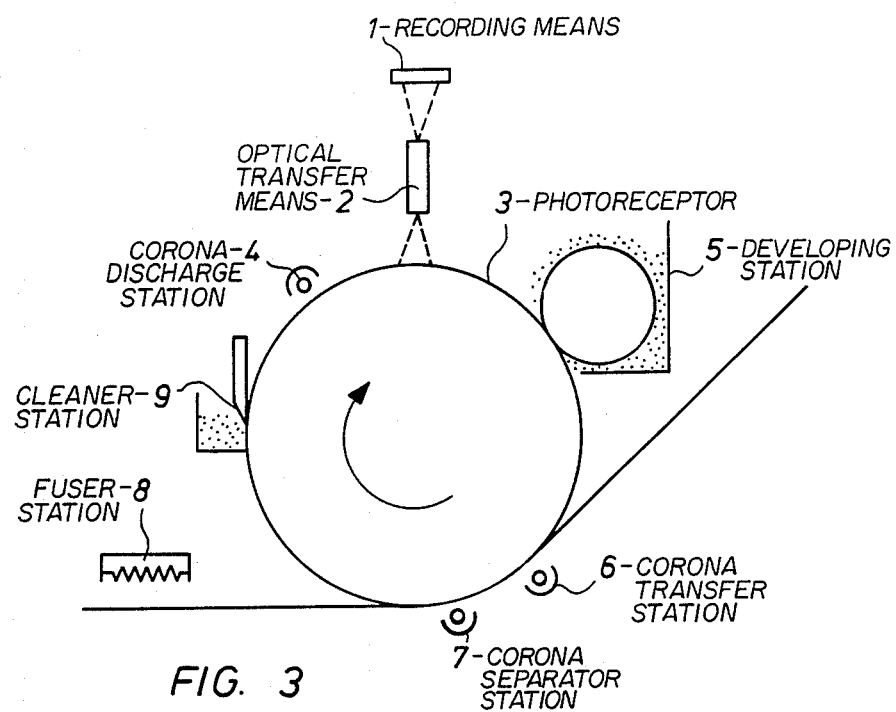

Referring to FIG. 3, a recording apparatus is shown for linewise recording of information upon a moving photoreceptor. The apparatus comprises basic elements known in the art namely a recording head (1) that is provided with a plurality of light-emitting elements and electronic driver circuits for these light-emitting elements, optical transfer means (2) for transferring and focusing the emitted light, and a photoreceptor (3) in the form of a cylindrical surface of a drum. The representation of the photo-electric surface in the form of a drum is merely for illustrative purposes and may take an other form e.g. the form of a belt.

The apparatus comprises a corona discharge station (4) that electrically charges the surface of the rotating drum. The areas of the drum surface that are exposed by the emitters become discharged whereas the others maintain their charge. The electrostatic charge pattern thus produced is developed by a developing station (5) wherein a developer composition is brought into contact with the charge pattern on the drum. A corona transfer station (6) transfers the toner pattern from the drum surface onto a paper sheet so that a permanent copy is obtained. A corona separator station (7) is effective to separate the paper sheet from the drum. A fuser station (8) is applied for fusing the toner pattern on the sheet so that a permanent copy is obtained. A cleaner station (9) may be operative to remove the excess of toner from the drum surface before a next exposure is made.

The above-mentioned recording head can e.g. consist of an integrated LED-array together with the associated driving circuits that are connected to the light-emitting elements by wire bonding. It could also be replaced by a recording head according to the present invention comprising a number of aligned modules, each of said modules consisting of a number of LEDs and associated driver circuitry on one single substrate.

An integrated embodiment is much more reliable than the wire-bonded embodiment.

Such an embodiment has a further advantage that each of the modules can be tested before it is incorporated in the recording head or it can be replaced when some defects would occur.

Figure 4:
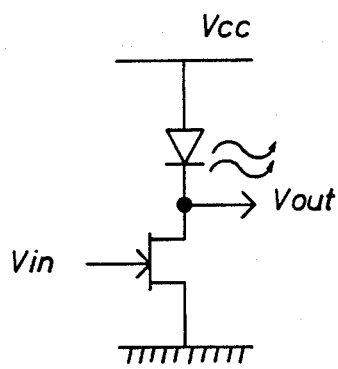

FIG. 4 shows the basic configuration of a LED and a FET structure that are connected in series so that the transistor determines the current through the diode. In one module several diodes have a common anode configuration and are each connected to a driver by their cathode terminal. In further applications, a logic circuit based on MESFET can be connected to the basic LED-driver circuit by the gate electrode of the MESFET.

Figure 5:
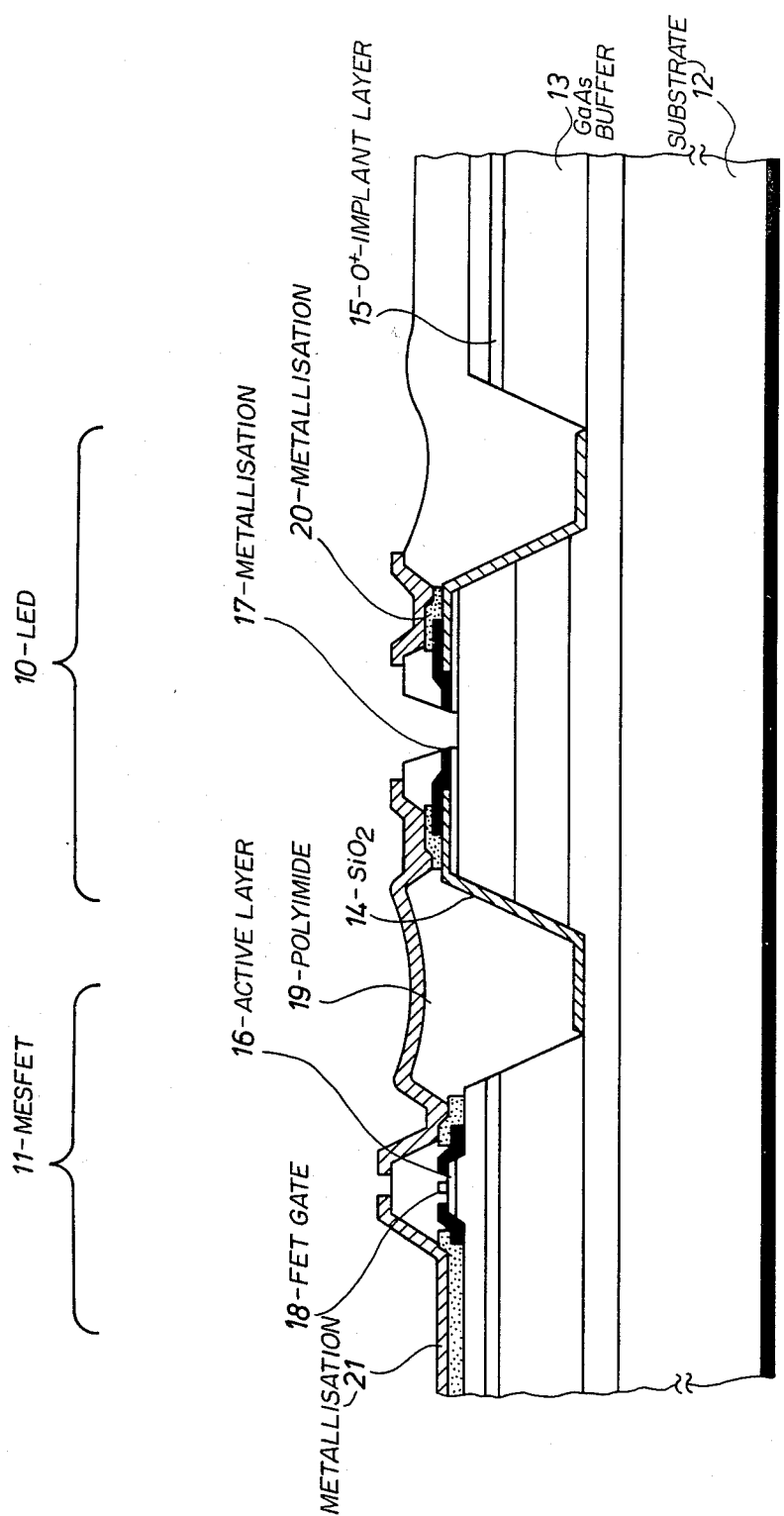

FIG. 5 shows the configuration of one LED and one MESFET as they are integrated on a common conductive p-type GaAs substrate according to the present invention. Next to a LED-mesa (10), formed on top of the GaAs substrate (12), an electronic driver crcuit (11) is integrated on an undoped GaAs bufferlayer (13) which itself is selectively grown on top of the substrate near the LED mesa. For this purpose the LED-mesa is covered with a SiO$_2$-layer (14).

The bufferlayer has a thickness equal to the height of the LED-mesa and therefore provides planarisation on the optical and driving devices. Said bufferlayer furthermore acts as an insulation layer between the substrate and the active layer of the electronic driver circuitry.

A deep O$^+$ implantation (15) in said bufferlayer provides a film with semi-insulating characteristics and improves the electrical insulation between devices from one another. The specific resistivity is about $10^8$ ohmcm. The active layer of the transistor (16) is produced by Si-ion implanatation. The contact metallisations of the LED (17) are formed and the recessed gate FET (FET gate 18) is fabricated. Spin coated polymide (19) is subsequently applied. Its insulating ad planarising characteristics permit the interconnection of the optical elements and the driver transistors.

First and second metallisations are respectively denoted with reference numbers (20) and (21).

FIG. 6 describes the subsequent processing steps for the integration of a number of LED structures with an equal number of MESFET drivers on a common conductive p-type GaAs substrate.

The device fabrication starts with the growth of four LED structures on a common conductive p-type GaAs substrate (p exceeding $10^{18}$ cm$^{-3}$)

The use of a p-type substrate implies in that the LEDs will have a common anode configuration and will each be connected to their associated driver by their cathode terminal. (cfr. FIG. 3 for the circuit scheme).

Said driver electronics will be ntegrated next to the diodes on the same substrate.

Figure 6A:
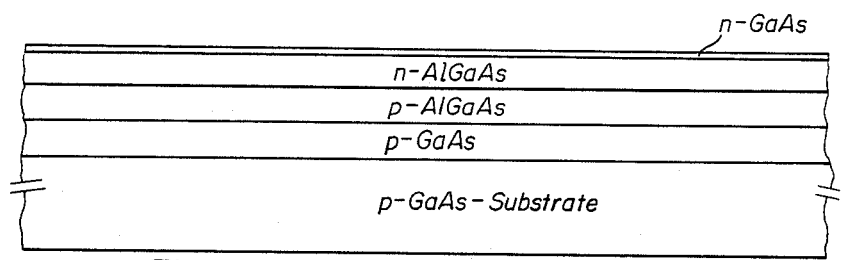

FIG. 6a: The first processing step consists of the growth of four multilayer double heterostructure LEDs by means of the vapour phase epithaxy (VPE) technique, known in the art. Said VPE grown structure consists of a 2 micrometer thick p-GaAs layer. an 8.5 micrometer thick Al$_{0.32}$Ga$_{0.68}$As, a 2 micrometer thick Al$_{0.70}$GA$_{0.30}$As layer, and a 0.2 micrometer thick GaAs layer subsequently grown on top of each other on the p-type substrate.

Figure 6B:
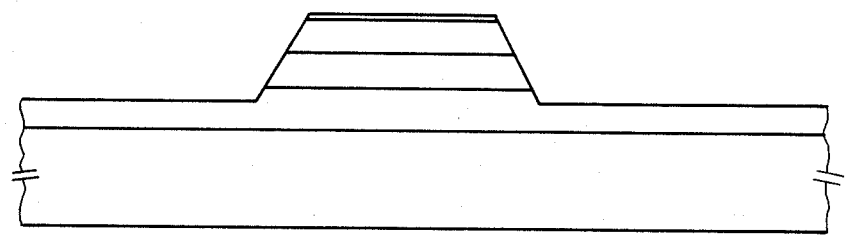

FIG. 6b: Next the layers are Ar-plasma etched up to the p-GaAs layer to obtain four LED-mesas of 10 micrometer high.

Figure 6C:
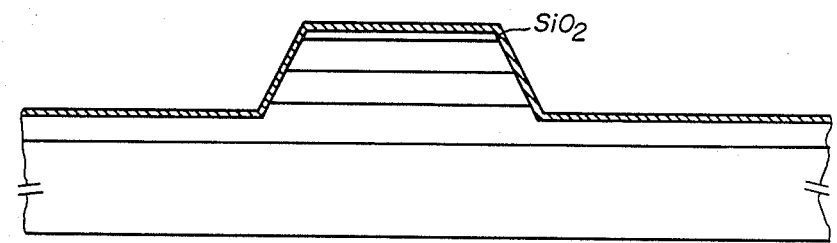

FIG. 6c: In the following processing step a 250 nanometer thick silicon dioxide layer is sputtered on the wafer.

Figure 6D:
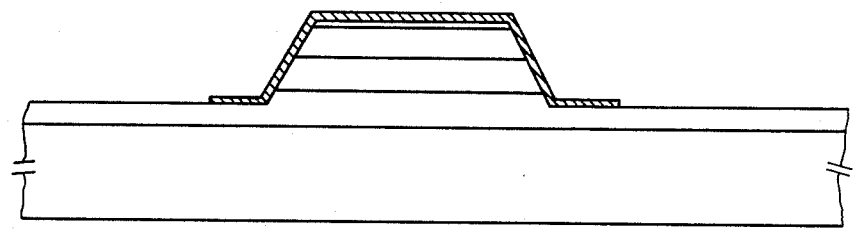

FIG. 6d: This layer is subsequently etched to cover only the four LED mesas.

Figure 6E:
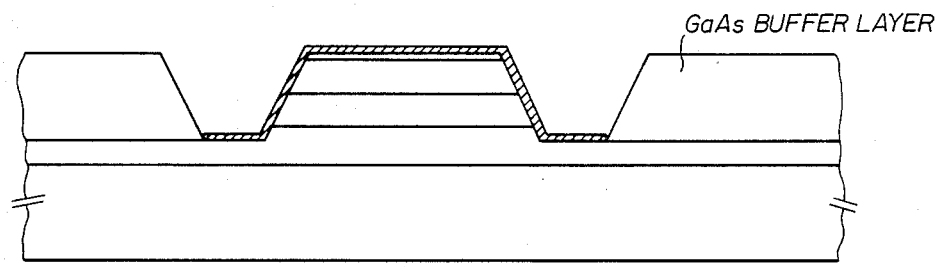

FIG. 6e: In the following processing step an undoped, insulating GaAs bufferlayer is selectively grown on the uncovered areas. SiO$_2$ acts as a protective layer where no growth takes place. Said GaAs layer is selectively grown by the metal organic chemical vapour deposition technique (MOCVD), known to those who are skilled in the art. The thickness of this layer has to be equal to the height of the LED-mesa in order to obtain a quasi planar surface.

To improve the gradient of the side walls of the selective grown GaAs regions and to remove occasionally polycrystalline growth on the SiO$_2$, the GaAs is etched around the LED mesas wth a H$_2$SO$_4$ solution. After etching, the structure consists of four LED-islands separated from four bufferlayer mesas.

Figure 6F:
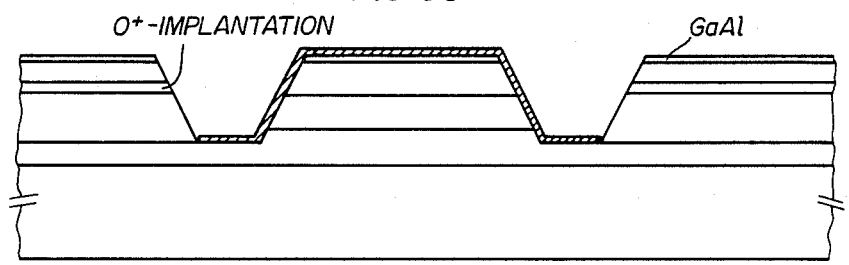

FIG. 6f: Next, O$^+$-ions and Si-ions are implanted in the bufferlayer. An O$^+$ implanation energy of about 350 keV and a dose of about $9.10^{14}$ cm$^{-2}$ is used. In the same run the implantation of the FET-active layer is achieved by means of Si-ion implantation.

To reach an equal donor distribution and to obtain a constant doping profile of the active layer within a depth of about 0.2 micrometer. two subsequent Si-ion implantation procedures are executed: the first one with an implantation energy of 50 keV and an implantation dose of $2.10^{13}$ cm$^{-2}$ and the second one with an implantation energy of 110 and 130 keV and an implantation dose of $5.10^{13}$ cm$^{-2}$. The LED mesa's were covered during the implantation by a 6.2 micrometer thick photoresist layer. Next the chip is annealed at 800° C. for 30 min. in an As atmosphere.

Figure 6G:
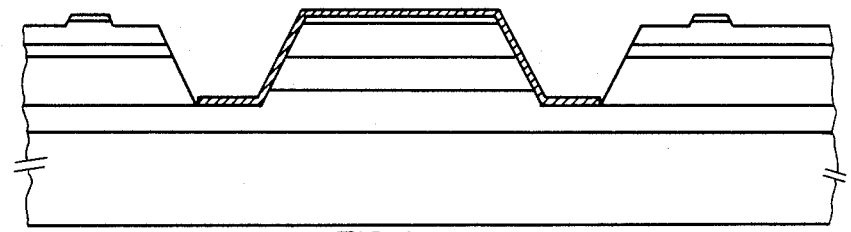

FIG. 6g: In the following processing step, the transistor mesas and the SiO$_2$-windows are etched.

Figure 6H:
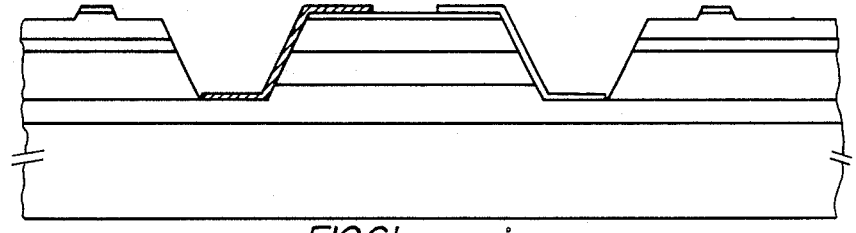

FIG. 6h shows the structure after these two etchings.

Figure 6I:
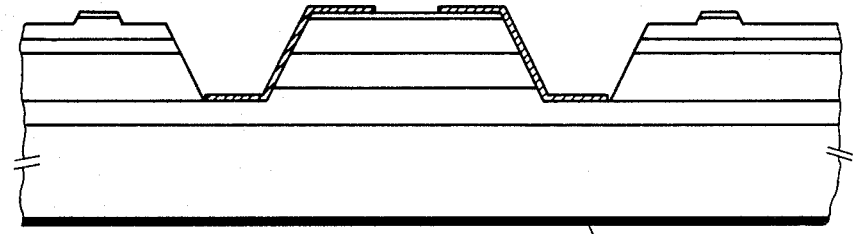

FIG. 6i: Next the ohmic contacts are formed on the backside by evaporation of Ni-AuZn (10-100 nanometer).

Figure 6J:
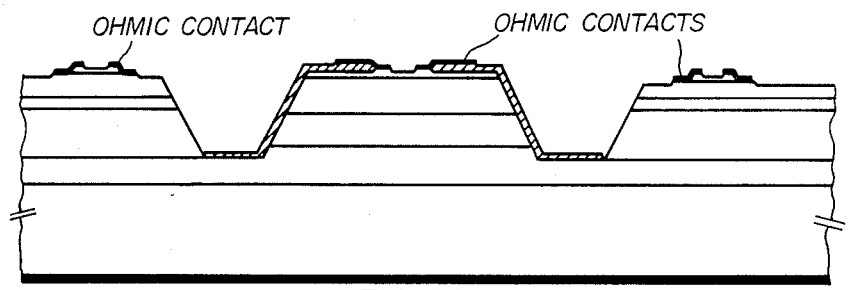

FIG. 6j shows the ohmic contacts on the frontside that are formed by Ni-AuGe-Ni (10-200-10 nanometer) evaporation followed by metal lift-off. These contacts on the front side represent the cathode terminal of the light-emitting diodes and the source-drain contact of the field effect transistors. All these contacts are alloyed in a N$_2$ atmosphere at 465° C.

Figure 6K:
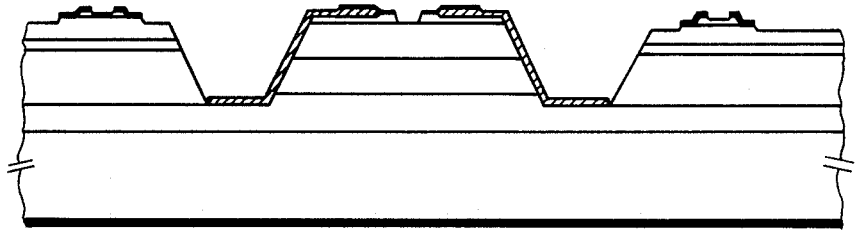

FIG. 6k: Subsequently, to avoid reabsorption of the emitted light of the LEDs, the GaAs top layer of the LED-multilayer structure is removed with a NH$_4$OH-solution.

Figure 6L:
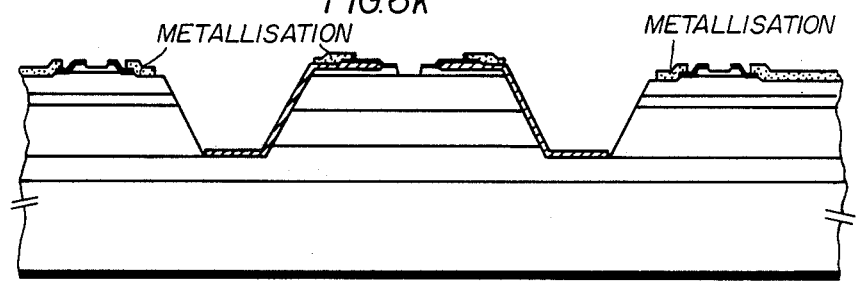

FIG. 6l: The first metallisations are formed by Ti-Pt-Au (10-10-100 nanometer) evaporation followed by lift-off.

Figure 6M:
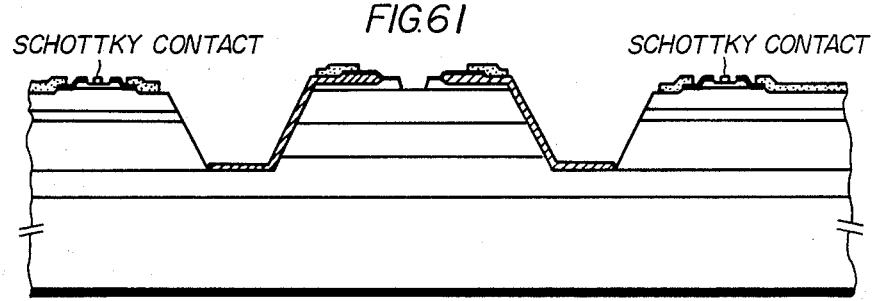

FIG. 6m: In a following processing step the transistors threshold voltage is adjusted by recessing the transistor channel under the gate area. Ar-plasma is used to etch the channel. The Schottky contacts are obtained again by metal evaporation (Ti-Pt-Au: 10-10-100 nanometer) and lift-off.

Figure 6N:
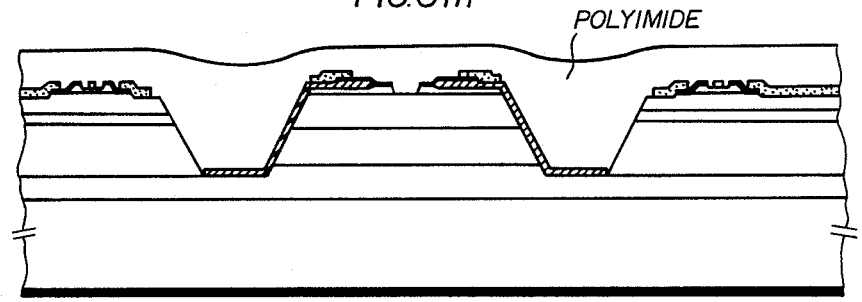

FIG. 6n: Planarisation is obtained by a two step polyimide covering procedure. Polyimide is spin coated to cover the whole wafer with a 2 micrometer thick planarising layer.

Figure 6O:
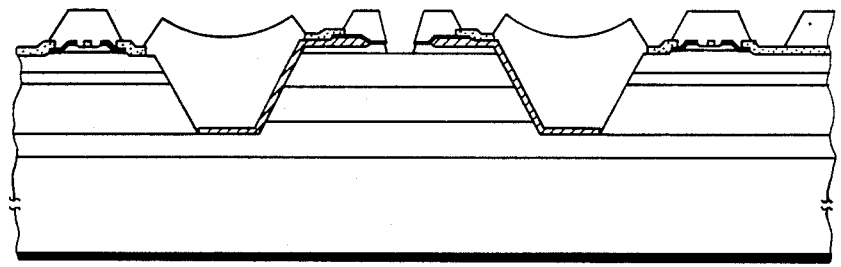

FIG. 6o: After gradually increasing the temperature up to 250° C. and baking for an hour, the layer is covered with photoresist and the desired contact hole structure is obtained by plasma-etching with an O$_2$-CH$_4$ plasma. Said plasma etching has the advantage that the etched holes have a slope of 45° which provides a very good reproducible metallisation coverage in the following processing step. Said polyimide layer also acts as an insulation layer between first and second metallisations.

Figure 6P:
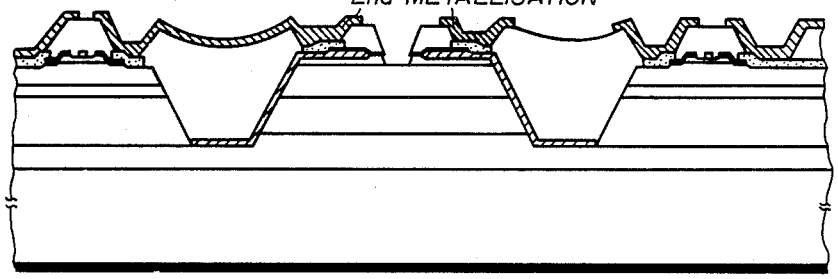

FIG. 6p: In the following processing step the second metallisations are provided by metal evaporation (Ti-Pt-Au: 10-10-100 nanometer) and lift-off.

Figure 7:
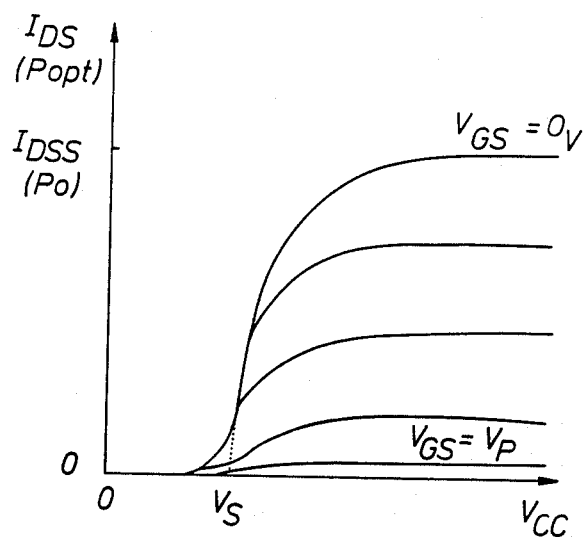

FIG. 7 represents the static characteristic of the complete opto-electronic device. Said characteristic shows a combination of the FET and the LED characteristic. LED and FET were connected in series. For power supplies lower than the LED threshold voltage $V_s$, a cutoff behaviour is observed. For power supplies exceeding $V_s$, the serial current between LED and FET can be varied between the FET saturation current $I_{DSS}$ for a gate potential of 0 volt, and cut-off when the pinch off voltage is applied to the gate electrode.

The intensity of the light emitted by the LED is proportional to the driving current.

Figure 8:
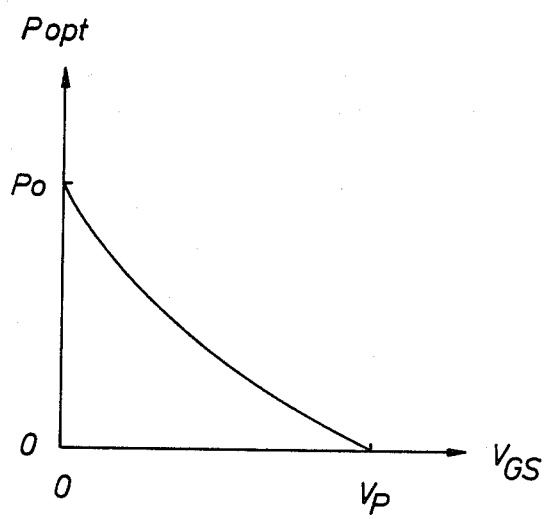

FIG. 8 represents the optical transfer characteristic for $V_{CC}$ exceeding $V_s$. The transistor is used as a current source so that the optical output intensity can be modulated between O and $P_o$ for $I=I_{DSS}$.

To obtain such a behaviour a good insulation has to be provided between the integrated devices. For this goal, a layer with semi-insulating characteristics ($R=10^8$ ohmcm) is made by O+-ion implantation in the buffer layer. As a consequence, the leakage current through the substrate is reduced.

Figure 9:
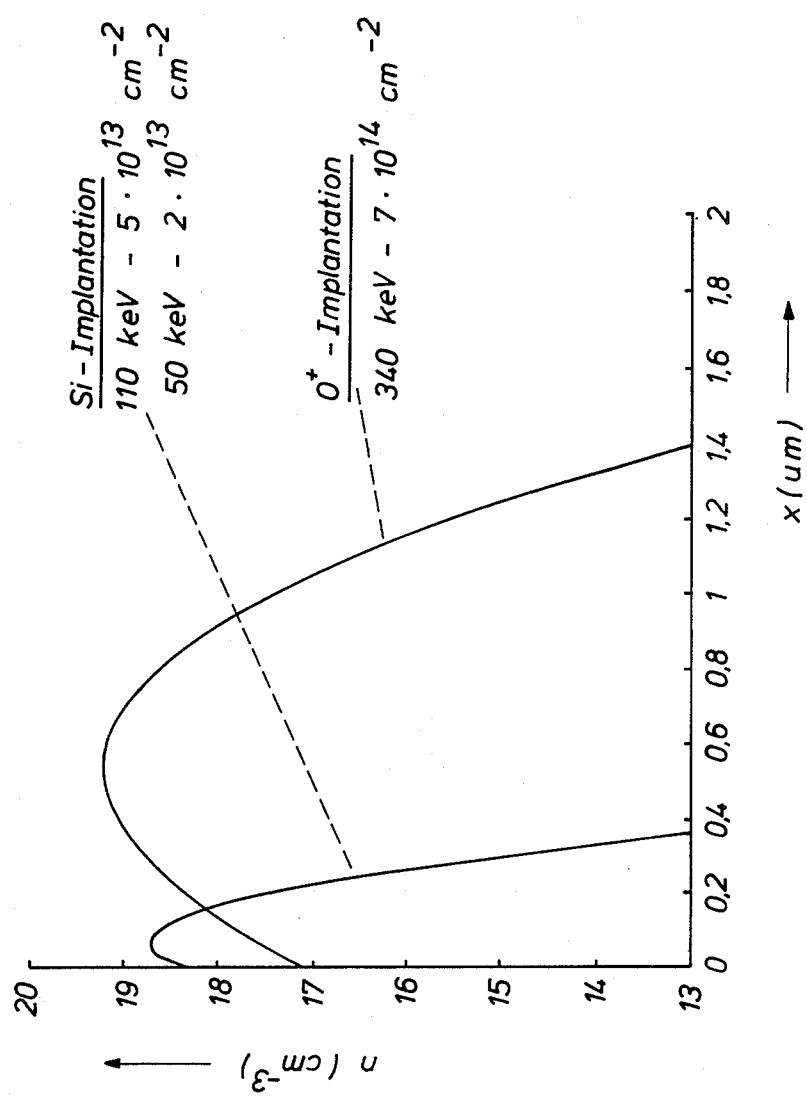

FIG. 9 shows the Si-ion and the O+-ion doping profile in the bufferlayer. Said profile is calculated with the help of the LSS theory, known in the art, and described by J. Lindhard, M. Scharff and H. E. Schiott in Kgl. Danske Videnskab. Selkab. Mat.-Fys. Medd. 33, No. 14 (1963).

The projected range is about 0.53 micrometer for 350 KeV O+-implantation in GaAs. The data used for the calculation of the implantation profiles are taken from J. F. Gibbons ans S. W. Mylroie on projected range statistics. Dowden, Hutschinson and Ross, Inc. Standsbrug, U.S.A. (1975).

For comparison, the Si-ion implantation profile used as FET active layer is redrawn. The projected range of the Si-ion with an implantation energy of 50 and 110 KeV is about 0.093 micrometer.

Figure 10:
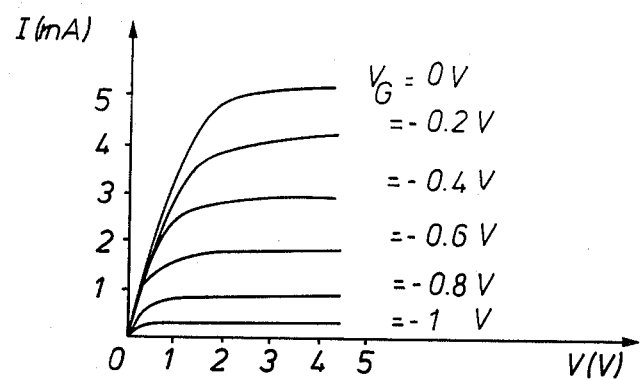

FIG. 10 shows the characteristics of a recessed gate FET fabricated with such a profile for the active layer. The saturation current is 5.3 mA. the pinch off voltage is about −1.2V and the transconductance about 5.5 mS.

Figure 11:
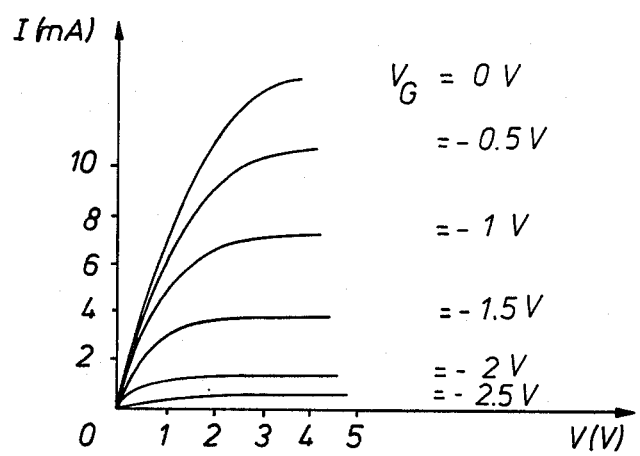
FIG. 11 shows the measured I-V characteristic of a recessed gate FET. The implantation energy of the channel is 50 and 130 KeV with implantaton doses of $2.10^{13}$ cm$^{-2}$ and $5.10^{13}$ cm$^{-2}$ respectively.

In FIG. 11 is shown that transistors having an active layer implanted with an energy of 50 and 130 KeV have a saturation current of 14 mA, a pinch off voltage of −2.5V and a transconductance of 7.2 mS.

Figure 12:
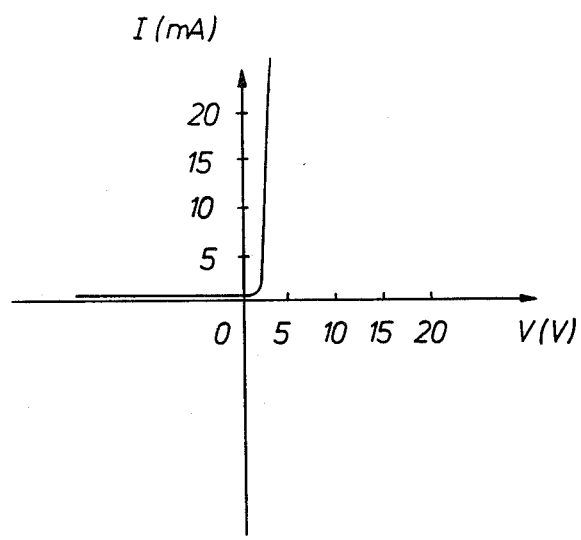
FIG. 12 shows the measured I-V characteristic of a LED.

FIG. 12: Sufficient light output intensity of the LEDs can be obtained by using such transistors as driving elements. The I-V characteristic of the LED shows a threshold voltage of 1.45V.

The various aspects of the invention have been described in connection with a certain type of LED and a certain type of FET. However, the invention is not intended to be limited thereto. Other appropriate optical components as LASER and photodetector and other appropriate transistors as MESFET. MOSFET, or HEMTs can be used.

We claim:

1. A device comprising
   a GaAs p-type conductive layer representing a substrate,
   a number of double heterostructure light-emitting diodes each comprising a first layer of GaAs of p-type, a second layer of a ternary compound of $Al_xGa_{1-x}As$ of p-type, a third layer of a ternary compound of $Al_xGa_{1-x}As$ of n-type, a fourth layer of GaAs of n-type, said heterostructures being etched to form a number of mesas on top of said substrate,
   a SiO$_2$-protecting layer grown on top of each mesa,
   a selectively grown GaAs undoped bufferlayer having a thickness equal to the height of said mesas and covering the surface of said substrate excluding each mesa,
   a semi-insulating layer formed by the implantation of O+-ions into said bufferlayer,
   a number of field effect transistor mesas equal to said number of light-emitting diodes, being formed by Si-ion implantation and etching on top of said bufferlayer,
   SiO$_2$-windows etched into said SiO$_2$-protecting layer,
   ohmic bonding contacts on the backside of the substrate and on said SiO$_2$-protecting layer close to the edges of said SiO$_2$-windows and on both sides of the field effect transistor mesas forming source and drain electrodes,
   light-emitting diode windows etched in said fourth n-type GaAs-layer of each of said light-emitting diodes,
   a first metallisation layer forming said bonding contacts and Schottky type contacts forming the gate electrodes of each of said field effect transistors,
   an insulating and planarising layer that covers said device,
   contact holes and light-emitting diode windows etched on said insulating and planarising layer,
   a second metallisation layer interconnecting said light-emitting diodes and said field effect transistors.

2. A recording head for linewise recording information upon a photoreceptor being built up by a plurality of recording modules arranged so that an uninterrupted row of light-emitting elements is formed along the length of said recording head, characterized in that each of said modules comprises
   a GaAs p-type conductive layer representing a substrate,
   a number of double heterostructure light-emitting diodes each comprising a first layer of GaAs of p-type, a second layer of a ternary compound of $Al_xGa_{1-x}As$ of p-type, a third layer of a ternary compound of $Al_xGa_{1-x}As$ of n-type, a fourth layer of GaAs of n-type, said heterostructures being etched to form a number of mesas on top of said substrate,
   a SiO$_2$-protecting layer grown on top of each mesa,
   a selectively grown GaAs undoped bufferlayer having a thickness equal to the height of said mesas and covering the surface of said substrate excluding each mesa,
   a semi-insulating layer formed by the implantation of O+-ions into said bufferlayer,
   a number of field effect transistor mesas equal to said number of light-emitting diodes, being formed by Si-ion implantation and etching on top of said bufferlayer,
   SiO$_2$-windows etched into said SiO$_2$-protecting layer,
   ohmic bonding contacts on the backside of the substrate and on said SiO$_2$-protecting layer close to the edges of said SiO$_2$-windows and on both sides of the field effect transistor mesas forming source and drain electrodes, light-emitting diode windows etched in said fourth n-type GaAs-layer of each of said light-emitting diodes, a first metallisation layer forming said bonding contacts and Schottky type contacts forming the gatae electrodes of each of said field effect transistors, an insulating and planarising layer that covers said module, contact holes and light-emitting diode windows etched on said insulating and planarising layer, a second metallisation layer interconnecting said light-emitting diodes and said field effect transistors.

3. Device according to claims 1 or 2 wherein said insulating and planarising layer is a polyimide layer.

* * * * *